United States Patent
Arata et al.

(10) Patent No.: US 11,085,702 B2
(45) Date of Patent: Aug. 10, 2021

(54) HEAT SINK

(71) Applicant: Mitsubishi Electric Corporation, Tokyo (JP)

(72) Inventors: Kazuki Arata, Tokyo (JP); Masayoshi Tamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 11 days.

(21) Appl. No.: 16/466,397

(22) PCT Filed: Mar. 17, 2017

(86) PCT No.: PCT/JP2017/010978
§ 371 (c)(1),
(2) Date: Jun. 4, 2019

(87) PCT Pub. No.: WO2018/138936
PCT Pub. Date: Aug. 2, 2018

(65) Prior Publication Data
US 2019/0331428 A1    Oct. 31, 2019

(30) Foreign Application Priority Data
Jan. 24, 2017 (JP) .............................. JP2017-009994

(51) Int. Cl.
*F28F 7/00* (2006.01)
*F28D 15/00* (2006.01)
(Continued)

(52) U.S. Cl.
CPC .............. *F28D 15/00* (2013.01); *F28F 13/08* (2013.01); *H01L 23/3672* (2013.01);
(Continued)

(58) Field of Classification Search
CPC ....... F28D 15/00; F28F 13/08; F28F 2215/00; H01L 23/3672; H01L 23/473; H05K 7/20409
(Continued)

(56) References Cited

U.S. PATENT DOCUMENTS 4,995,450 A * 2/1991 Geppelt .................. F24T 10/40
165/104.21
5,168,348 A * 12/1992 Chu ...................... H01L 23/367
257/713
(Continued)

FOREIGN PATENT DOCUMENTS

JP    2005-20881 A    1/2005
JP    2011-040554 A   2/2011
(Continued)

OTHER PUBLICATIONS

Office Action dated Feb. 3, 2020, from the China National Intellectual Property Administration in Application No. 201780084014.8.
(Continued)

*Primary Examiner* — Davis D Hwu
(74) *Attorney, Agent, or Firm* — Sughrue Mion, PLLC; Richard C. Turner

(57) ABSTRACT

A pin-shaped first heat radiating fin low in fluid resistance is disposed in a region required to be high in cooling performance, and a second heat radiating fin high in fluid resistance of a shape in which a plurality of columns of grooves which each meander in zigzag at a narrow pitch are arranged side by side is disposed in a region only necessary to be low in cooling performance. Furthermore, the first and second heat radiating fins are installed in parallel to a direction of flow of refrigerant.

17 Claims, 4 Drawing Sheets

(51) Int. Cl.
  *F28F 13/08* (2006.01)
  *H01L 23/367* (2006.01)
  *H01L 23/473* (2006.01)
  *H05K 7/20* (2006.01)

(52) U.S. Cl.
  CPC ....... *H01L 23/473* (2013.01); *H05K 7/20409* (2013.01); *F28F 2215/00* (2013.01)

(58) Field of Classification Search
  USPC ....................................................... 165/80.4
  See application file for complete search history.

(56) References Cited

U.S. PATENT DOCUMENTS

| | | | |
|---|---|---|---|
| 6,140,571 A * | 10/2000 | Kitahara | ............. G03F 7/70433 165/185 |
| 2004/0177949 A1 * | 9/2004 | Shimoya | ................. F28F 1/126 165/152 |
| 2006/0230616 A1 * | 10/2006 | Zaghlol | ............... H01L 21/4882 29/890.049 |
| 2007/0002538 A1 | 1/2007 | Tomioka | |
| 2008/0202730 A1 | 8/2008 | Onishi et al. | |
| 2012/0018741 A1 | 1/2012 | Sato | |
| 2012/0139096 A1 | 6/2012 | Gohara et al. | |
| 2012/0211214 A1 * | 8/2012 | Phan | ................... H01L 23/3677 165/185 |
| 2013/0292091 A1 | 11/2013 | Ishikawa | |
| 2017/0010047 A1 * | 1/2017 | Lv | ............................ F28F 9/001 |
| 2018/0024599 A1 | 1/2018 | Sakata et al. | |

FOREIGN PATENT DOCUMENTS

| | | |
|---|---|---|
| JP | 2012-44140 A | 3/2012 |
| JP | 5605438 B2 | 10/2014 |
| WO | 2012/114475 A1 | 8/2012 |
| WO | 2016/194158 A1 | 12/2016 |

OTHER PUBLICATIONS

JPO Office Action for Application No. 2017-009994 dated Feb. 6, 2018.
International Search Report for PCT/JP2017/010978 dated Jun. 6, 2017 [PCT/ISA/210].
Communication dated Jan. 2, 2020, from the European Patent Office in application No. 17894434.4.
Communication dated May 11, 2021 from the European Patent Office in EP application No. 17 894 434.4.

* cited by examiner

400

HEAT SINK

CROSS REFERENCE TO RELATED APPLICATIONS

This application is a National Stage of International Application No. PCT/JP2017/010978, filed on Mar. 17, 2017, which claims priority from Japanese Patent Application No. 2017-009994, filed on Jan. 24, 2017.

TECHNICAL FIELD

The present application relates to a heat sink which cools, for example, heat generating elements.

BACKGROUND ART

As a SiC (silicon carbide) power semiconductor chip is high in cost, a so-called chip shrink which reduces the size of the chip is essential, and as a result, the heat generation density increases, leading to a high temperature, and so a heat sink having a high heat transfer coefficient is required.

On the other hand, in some cases, a component low in heat generation density, together with SiC high in heat generation density, is disposed on the identical heat sink.

When refrigerant is caused to flow at a uniform flow rate throughout the whole heat sink despite the fact that the component low in heat generation density is low in cooling performance but is sufficiently cooled, there is a problem in that it is over-engineered in heat radiating performance for a region only necessary to be low in cooling performance, consuming extra energy for causing cooling water to circulate. It is desirable, therefore, that the flow rate of refrigerant is adjusted so as to cause refrigerant to flow at a small flow rate through a region only necessary to be low in cooling performance and to cause refrigerant to flow at a large flow rate through a region required to be high in cooling performance, leading to the conservation of energy consumed to cause the refrigerant to circulate.

As a method of adjusting the flow rate of refrigerant in the heat sink, for example, Japanese Patent No. 5605438 (PTL 1) proposes a method whereby pin fins different in diameter are disposed, thus decreasing the fluid resistance of a region through which to cause refrigerant to flow at a large flow rate, and increasing the fluid resistance of a region through which to cause refrigerant to flow at a small flow rate.

CITATION LIST

Patent Literature

PTL 1: Japanese Patent No. 5605438

The heretofore mentioned method disclosed in PTL 1 is such that pin fins existing in the flow path of a cooler are changed in diameter and disposed, thereby adjusting the sectional area of the flow path, and changing the fluid resistances of local regions, thus adjusting the flow rate. With a heretofore described kind of heretofore known method, however, there is a problem in that it is not possible to make an extreme difference in flow rate, such as by making a difference of more than twice in flow rate per sectional area, on the identical heat sink. It is also possible to make a large difference in flow rate by increasing the fluid resistance with an obstacle, such as a wall or a diaphragm, provided in the region through which to cause refrigerant to flow at the small flow rate, but there is a problem in that it increases the pressure loss of the heat sink, resulting in an increase in energy consumption.

Solution to Problem

The present application has been made to solve the above problems and an object of the present application is to obtain a heat sink wherein it is possible, by providing a region small in flow rate and a region large in flow rate on the identical heat sink, to suppress an increase in pressure loss while increasing the cooling performance for a component high in heat generation density and decreasing the cooling performance for a component low in heat generation density.

The heat sink disclosed in the present application is a heat sink having provided on a base thereof a plurality of heat radiating fins, the heat radiating fins being configured including a first heat radiating fin of a shape in which a plurality of columns of grooves which each meander at a narrow pitch and a pin-shaped second heat radiating fin are arranged side by side, wherein the first and second heat radiating fins are disposed, on an identical flat surface of the base, in parallel to a direction of flow of refrigerant.

According to the heat sink disclosed in the present application, as the refrigerant, which has flowed into the first heat radiating fin of the shape in which the plurality of columns of grooves which each meander at the narrow pitch are arranged side by side, repeatedly hits against the wall of each groove and changes the direction of flow, the fluid resistance is very high, and an inflow rate of refrigerant per sectional area is small. On the other hand, as the fluid resistance of the pin-shaped second heat radiating fin is low, the inflow rate of refrigerant per sectional area of the second heat radiating fin is large. Furthermore, the first and second heat radiating fins are disposed in parallel to the flow of refrigerant, and thereby it is possible to suppress the total pressure loss.

DESCRIPTION OF EMBODIMENTS

Hereafter, a description will be given, based on the drawings, of embodiments of a heat sink according to the present application. In the individual drawings, identical or equivalent portions will be described with identical signs assigned thereto.

First Embodiment

Figure 1:
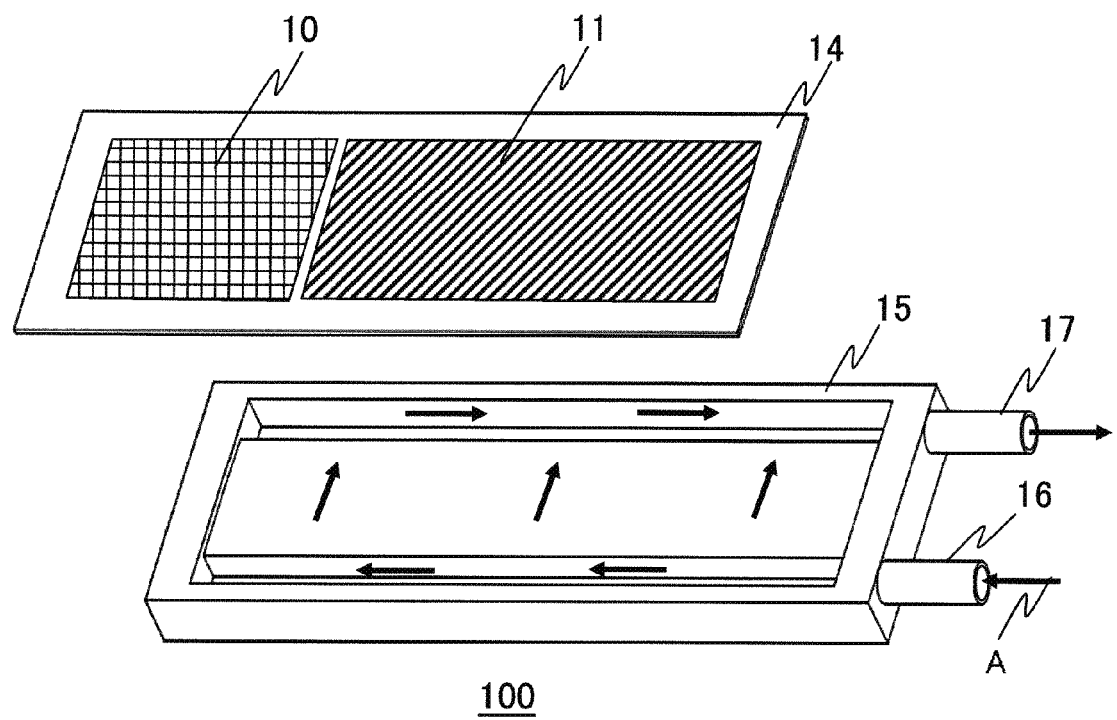
FIG. 1 is an exploded perspective view showing a heat sink according to a first embodiment.
Figure 2:
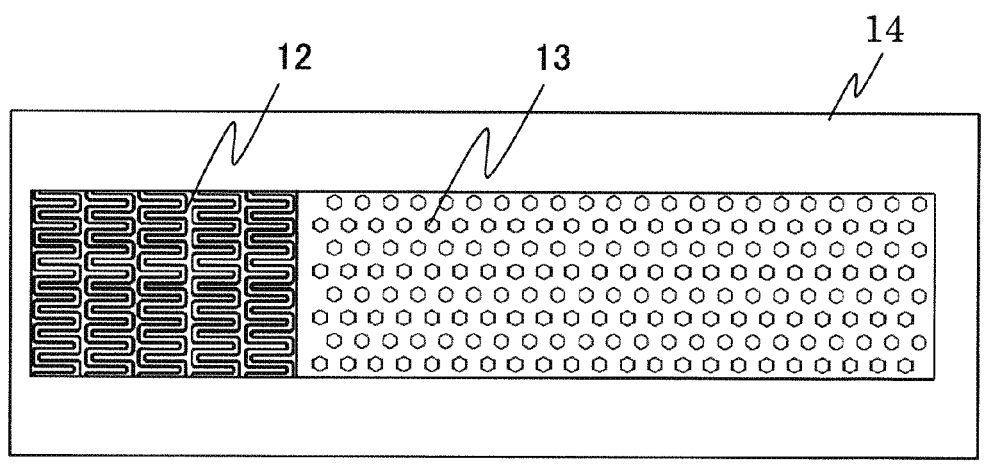
FIG. 2 is a plan view of a base as seen from a surface having disposed thereon fins of the heat sink according to the first embodiment.

FIG. 1 is an exploded perspective view showing a heat sink according to a first embodiment of the invention, and FIG. 2 is a plan view of a base as seen from a surface on which fins are disposed.

In FIGS. 1 and 2, a heat sink 100 according to the first embodiment is configured including a base 14, which has a surface 10 having installed thereon a heat generating element low in heat generation density, a surface 11 having installed thereon a heat generating element high in heat generation density, a first heat radiating fin 12 which is provided on the rear of the surface 10 having installed thereon the heat generating element low in heat generation density and which is of a shape in which a plurality of columns of grooves which each meander in zigzag at a narrow pitch are arranged side by side, and a pin-shaped second heat radiating fin 13 provided on the rear of the surface 11 having installed thereon the heat generating element high in heat generation density; a jacket 15 in which the base 14 is stored; and a refrigerant inlet portion 16 and a refrigerant outlet portion 17 which are both provided on one of a pair of opposing lateral faces of the jacket 15.

In the heat sink 100, refrigerant passes through the refrigerant inlet portion 16 and enters a space between the jacket 15 and the base 14, as shown by arrow A of FIG. 1. In the space, the refrigerant exchanges heat with the first and second heat radiating fins 12 and 13 which have received the heat from the heat generating elements, and the heat generating elements are cooled through the first and second heat radiating fins 12 and 13. The refrigerant which has received the heat through the heat exchange with the first and second heat radiating fins 12 and 13 is directly discharged outside the heat sink 100 through the refrigerant outlet portion 17. Any kind of refrigerant can be used irrespective of whether it is a liquid, a gas, or a gas-liquid mixture.

Figure 3:
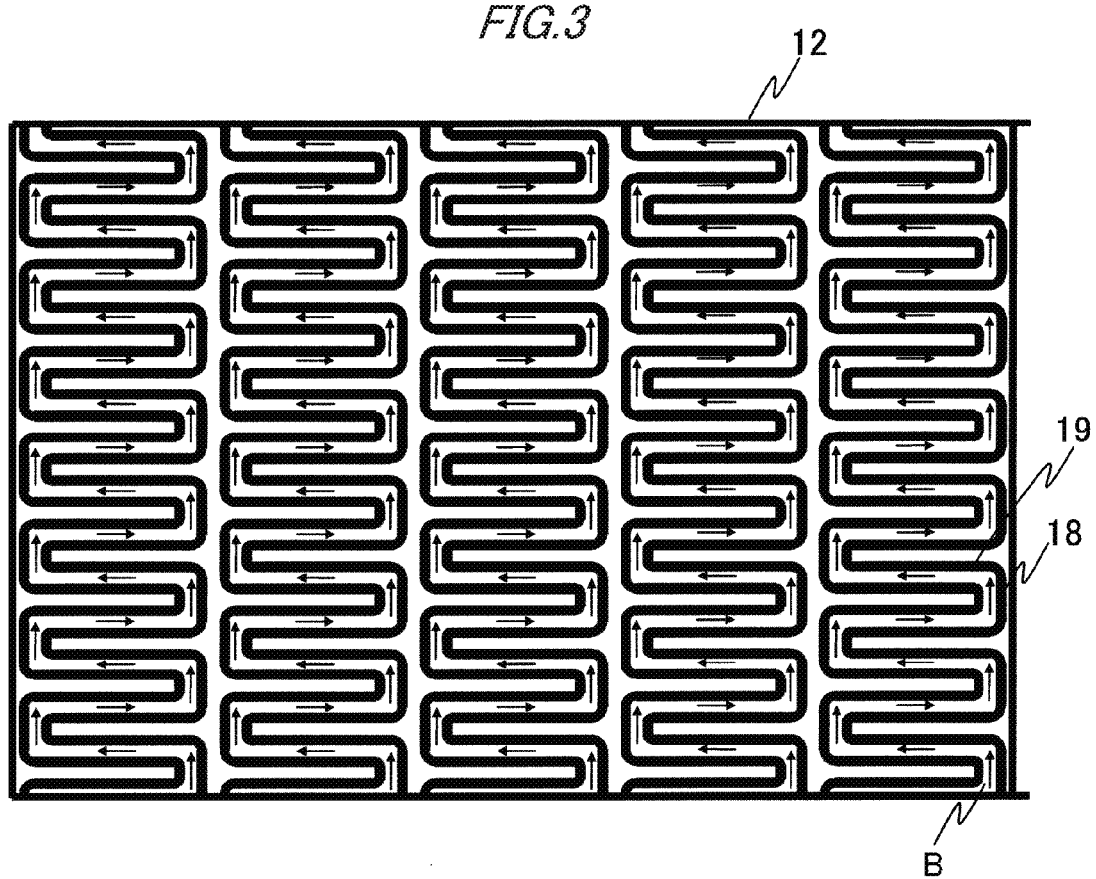
FIG. 3 is an enlarged view of the fin, shown in FIG. 2, of a shape in which a plurality of columns of grooves which each meander in zigzag at a narrow pitch are arranged side by side.

FIG. 3 is an enlarged view of the first heat radiating fin 12 of the shape in which the plurality of columns of grooves which each meander in zigzag at the narrow pitch are arranged side by side. In FIG. 3, refrigerant having flowed into the first heat radiating fin 12 flows into a short flow path 18 parallel to the direction of circulation of the refrigerant, as shown by arrow B. After that, the refrigerant hits against the wall of the flow path, makes a 90-degree turn in the direction of flow, and flows into a long flow path 19 perpendicular to the direction of circulation of the refrigerant. After that, the refrigerant, while hitting against the wall and making a 90-degree turn in the direction of flow, passes alternately through the short and long flow paths 18 and 19, and is discharged from the first heat radiating fin 12.

In this way, the refrigerant flows while repeating a hit against the wall of the flow path and a 90-degree turn in the direction of flow, thus resulting in an immense increase in fluid resistance.

On the other hand, refrigerant passing through the pin-shaped second heat radiating fin 13 which is disposed, in parallel to the flow of the refrigerant, adjacent to the first heat radiating fin 12 of the shape in which the plurality of columns of grooves which each meander in zigzag at the narrow pitch are arranged side by side, does not changes sharply in the direction of flow compared with that when passing through the first heat radiating fin 12, and the flow path sectional area per sectional area in the direction of circulation of the refrigerant is large, so that the fluid resistance is low.

A description has heretofore been given of the shape of the first heat radiating fin 12 in which the plurality of columns of cranked meandering grooves which make a 90-degree turn in the direction of flow of the refrigerant are arranged side by side, but the first heat radiating fin 12 may be of, for example, a shape in which a plurality of columns of V-shaped meandering grooves are arranged side by side.

When the first heat radiating fin 12 high in fluid resistance and the second heat radiating fin 13 low in fluid resistance are disposed in parallel, as above, the second heat radiating fin 13 is larger in the refrigerant flow rate per sectional area in the direction of circulation of the refrigerant. Accordingly, the refrigerant flow rate immediately below the surface 11 having installed thereon the heat generating element high in heat generation density is large, and the heat sink 100 provides the heat generating element high in heat generation density with high cooling performance, and provides the heat generating element low in heat generation density with low cooling performance, enabling more conservation of energy for causing the refrigerant to circulate than when causing a large flow rate of refrigerant to flow uniformly throughout the whole heat sink.

Second Embodiment

Figure 4:
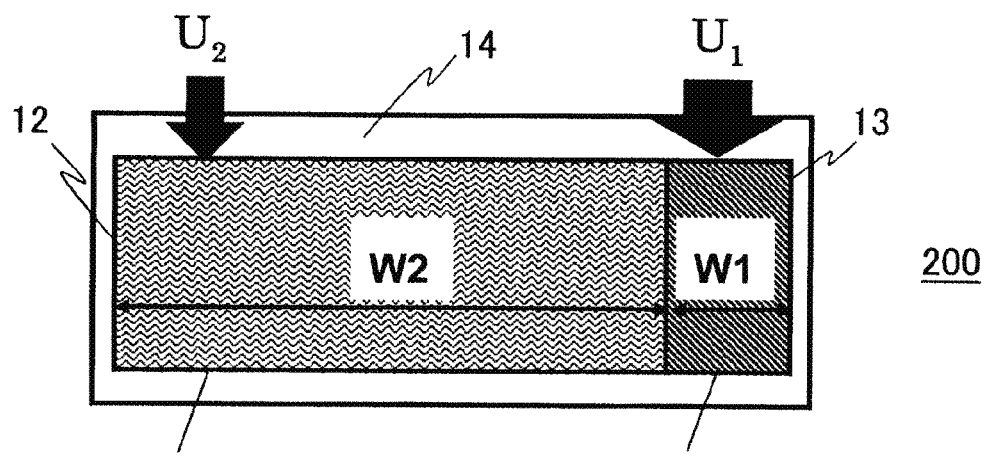
FIG. 4 is a schematic diagram of a base as seen from a surface having disposed thereon fins of a heat sink according to a second embodiment.

Next, a description will be given of a heat sink according to a second embodiment. FIG. 4 is a schematic diagram of a base as seen from a surface having disposed thereon heat radiating fins of a heat sink 200 according to the second embodiment.

The first heat radiating fin 12 high in fluid resistance of the shape in which the plurality of columns of grooves which each meander in zigzag at the narrow pitch are arranged side by side, and the pin-shaped second heat radiating fin 13 low in fluid resistance, are disposed in parallel on the base 14, and in general, as refrigerant flows at a small flow rate through the first heat radiating fin 12 high in fluid resistance, and refrigerant flows at a large flow rate through the second heat radiating fin 13 low in fluid resistance, the second heat radiating fin 13 is higher in cooling performance than the first heat radiating fin 12.

When a fin region width W1 in a direction perpendicular to the direction of circulation of the refrigerant for the second heat radiating fin 13 low in fluid resistance is significantly smaller than a fin region width W2 in a direction perpendicular to the direction of circulation of the refrigerant for the first heat radiating fin 12 high in fluid resistance, as shown in FIG. 4, however, the second heat radiating fin 13 low in fluid resistance increases in fluid resistance due to its decrease in sectional area, and so there is a case in which there arises a problem in that a reverse in refrigerant flow rate occurs, i.e., the first heat radiating fin 12 high in fluid resistance becomes larger in refrigerant flow rate than the second radiating fin 13 low in fluid resistance, causing a deficiency in the cooling performance for the heat generating element high in heat generation density. The problem is apt to occur, for example, in the case where the width W1 is extremely narrower than the width W2 for layout reasons.

In order to avoid the heretofore mentioned problem, in the heat sink of the second embodiment, the cooling performance and pressure loss characteristics of the heat radiating fins are appropriately adjusted by the method shown as follows.

When the second heat radiating fin 13 low in fluid resistance is represented by suffix 1, the first heat radiating fin 12 high in fluid resistance is represented by suffix 2, h is set as a heat conductivity which serves as an indication of cooling performance, P as a pressure loss, U as a front flow velocity, and γ, δ, m, and n as constants to be determined by a fin shape, the respective heat conductivities h and pressure losses P of the individual regions can be represented by the following expressions (1) to (4).

$$h_1 = \gamma_1 U_1^{m1} \quad (1)$$

$$P_1 = \delta_1 U_1^{n1} \quad (2)$$

$$h_2 = \gamma_2 U_2^{m2} \quad (3)$$

$$P_2 = \delta_2 U_2^{n2} \quad (4)$$

Here, as the refrigerant is caused to flow in parallel to the heat radiating fins, $P_1 = P_2$ is established.

From the expressions (2) and (4), $$\delta_1 U_1^{n1} = \delta_2 U_2^{n2}$$

Therefore, the following expression (5) is obtained.

$$U_2 = \{(\delta_1/\delta_2) U_1^{n1}\}^{1/n2} \quad (5)$$

When the expression (5) is substituted into the expression (3) and put in order, $$h_2 = \gamma_2 \{(\delta_1/\delta_2) U_1^{n1}\}^{m2/n2} \quad (6)$$

is obtained.

Here, in order to make the second heat radiating fin 13 higher in cooling performance than the first heat radiating fin 12, it is only necessary that $h_2 < h_1$, and when $h_2 < h_1$ is substituted into the expression (6) and put in order, $$\{(\gamma_2 \delta_1)/(\gamma_1 \delta_2)\}^{m2/n2} < U_1^{(m1n2 - m2n1)/n2} \quad (7)$$

is obtained.

Here, it is known in general that the heat conductivity is approximately proportional to the 0.5th power of the flow velocity, and that the pressure loss is approximately proportional to the second power of the flow velocity, and $m_1 = m_2 = 0.5$ and $n_1 = n_2 = 2$ are set here for the sake of ease, substituted into the expression (7), and put in order, obtaining $$(\delta_1/\delta_2)^{0.25} < \gamma_1/\gamma_2 \quad (8)$$

The characteristics of the first and second heat radiating fins 12 and 13 are set so as to satisfy the expression (8), and thereby it is possible to reliably make the second heat radiating fin 13 higher in cooling performance than the first heat radiating fin 12.

Third Embodiment

Figure 5:
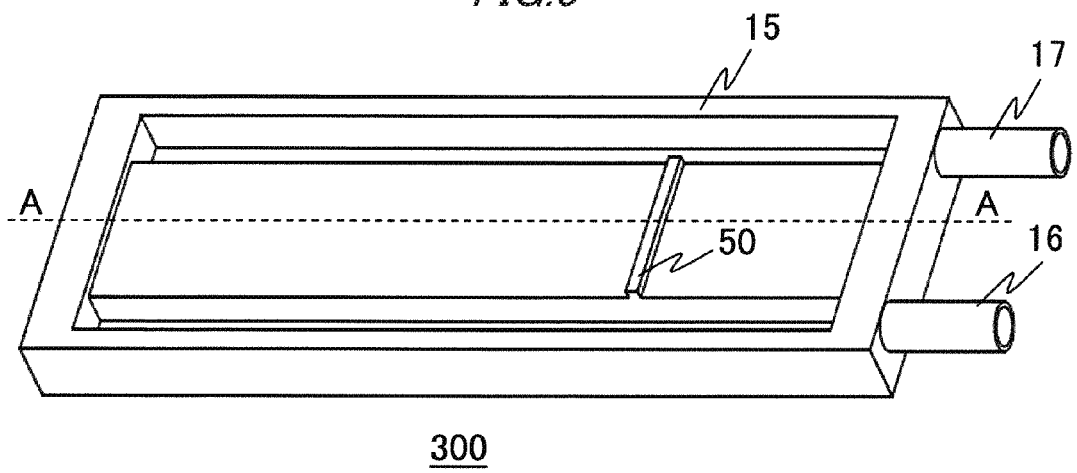
FIG. 5 is a perspective view of a jacket of a heat sink according to a third embodiment.
Figure 6:
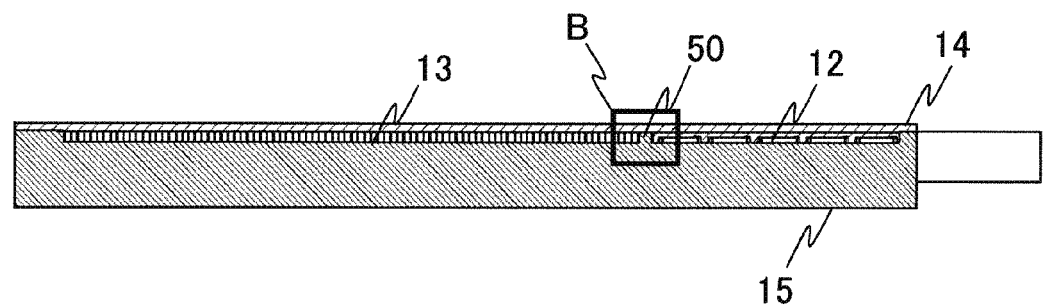
FIG. 6 is a sectional view along the arrowed line A-A of FIG. 5.
Figure 7:
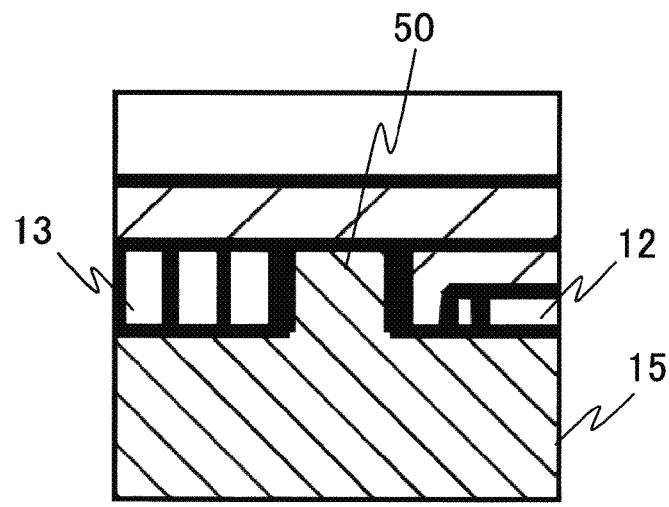
FIG. 7 is an enlarged view of the B portion of FIG. 6.

Next, a description will be given of a heat sink according to a third embodiment. FIG. 5 is a perspective view of a jacket of a heat sink 300 according to the third embodiment, FIG. 6 shows a sectional view along the arrowed line A-A of FIG. 5, and FIG. 7 shows an enlarged view of the B portion of FIG. 6.

When to manufacture the first heat radiating fin 12 of the shape in which the plurality of columns of grooves which each meander in zigzag at the narrow pitch are arranged side by side, and the pin-shaped second heat radiating fin 13, by, for example, die casting or forging, it is better, from the viewpoint of an improvement in die releasability and die life, to provide a clearance between the first and second heat radiating fins 12 and 13.

When the clearance is provided between the first and second heat radiating fins 12 and 13, however, the fluid resistance of the clearance is extremely low, and so refrigerant flows into the clearance at a large flow rate. The refrigerant having flowed into the clearance does not contribute to heat radiation, thus causing a deterioration in cooling performance.

In the heat sink 300 according to the third embodiment, therefore, a projection-like wall 50 is provided in such a position on the jacket 15 as to fill the clearance between the first and second heat radiating fins 12 and 13 when the jacket 15 and the base 14 are put together, and furthermore, the clearance between the wall 50 and the first heat radiating fin 12 and the clearance between the wall 50 and the second heat radiating fin 13 are made smaller than a smaller one of the clearance between the adjacent fins of the first heat radiating fin 12 and the clearance between the adjacent fins of the second heat radiating fin 13, thereby increasing the fluid resistance of the clearance between the wall 50 and the first heat radiating fin 12 or between the wall 50 and the second heat radiating fin 13, thus preventing the refrigerant from flowing through the clearance, enabling suppression of a deterioration in cooling performance.

Fourth Embodiment

Figure 8:
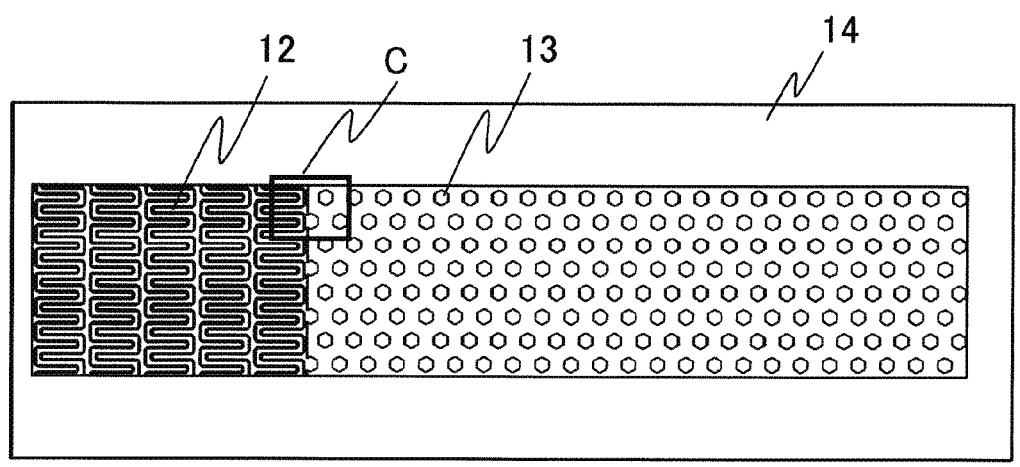
FIG. 8 is a plan view of a base as seen from a surface having disposed thereon fins of a heat sink according to the fourth embodiment.
Figure 9:
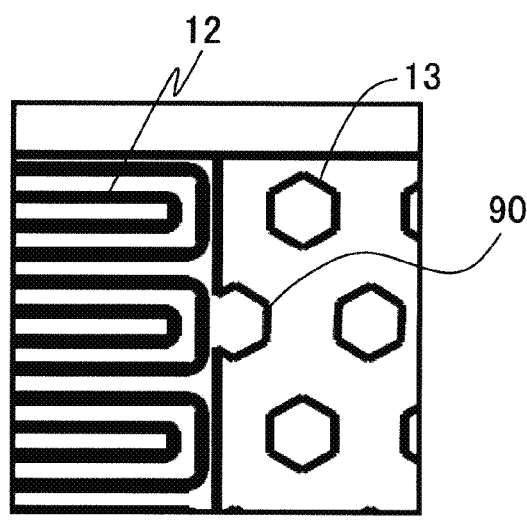
FIG. 9 is an enlarged view of the C portion of FIG. 8.

Next, a description will be given of a heat sink according to a fourth embodiment. FIG. 8 is a plan view of a base as seen from a surface having disposed thereon heat radiating fins of the heat sink according to the fourth embodiment, and FIG. 9 is an enlarged view of the C portion of FIG. 8.

In a heat sink 400 according to the fourth embodiment, protrusions 90 of a form in which some fins of the second heat radiating fin 13 are embedded in the first heat radiating fin 12 side end portion are provided to prevent refrigerant from flowing into the clearance between the first and second heat radiating fins 12 and 13 at a large flow rate.

The heat sink 400 according to the fourth embodiment is such that by providing the protrusions 90, the clearance between the protrusions 90 and the adjacent fins of the second heat radiating fin 13 becomes substantially equal in fluid resistance to the second heat radiating fin 13 itself, thus preventing refrigerant from flowing into the clearance between the first and second heat radiating fins 12 and 13 at a large flow rate, enabling suppression of a deterioration in cooling performance.

Fifth Embodiment

Next, a description will be given of a heat sink according to a fifth embodiment. In the heat sink of the fifth embodiment, the sectional shape of the fins of the pin-shaped second heat radiating fin is a regular hexagon, or a square or a regular triangle (not shown), and the regular hexagons, the squares, or the regular triangles are disposed so that all the sides of one are each opposite to a side of adjacent another and that the distances between the sides separate from and opposite to one another are equal to each other.

The pin-shaped second heat radiating fin is such that the larger the surface area per base area, the higher the cooling performance. In order to increase the surface area per base area, it is only necessary to dispose the fins of the second heat radiating fin so that all the lateral faces of one are each opposite to a lateral face of adjacent another and that the distances between the sides separate from and opposite to one another are equal to each other.

It is known in general that among n-sided polygons inscribed in circles with an identical radius, a regular n-sided polygon has the longest length of all its sides, and it is mathematically proven that among regular polygons, there are only three kinds: regular triangles, squares, and regular hexagons, which of the same kind can be disposed so that the distances between the sides separate from and opposite to one another are equal to each other.

As heretofore mentioned, the sectional shape of the fins of the pin-shaped second heat radiating fin is a regular hexagon, a square, or a regular triangle, and heat radiating fins wherein all the sides of one sectional shape are each opposite to a side of adjacent another, and the distances between the sides separate from and opposite to one another are equal to each other, are used as the fins of the second heat radiating fin, thereby enabling a particular improvement in the cooling performance of the second heat radiating fin. Furthermore, irregularities are provided on each lateral face of each fin of the second heat radiating fin, thereby stirring the refrigerant on the lateral faces of the fins, enabling an improvement in cooling performance.

Although the present application is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations, to one or more of the embodiments.

It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

REFERENCE SIGNS LIST

10 SURFACE HAVING INSTALLED THEREON HEAT GENERATING ELEMENT LOW IN HEAT GENERATION DENSITY,
11 SURFACE HAVING INSTALLED THEREON HEAT GENERATING ELEMENT HIGH IN HEAT GENERATION DENSITY,
12 FIRST HEAT RADIATING FIN,
13 SECOND HEAT RADIATING FIN,
14 BASE,
15 JACKET,
16 REFRIGERANT INLET PORTION,
17 REFRIGERANT OUTLET PORTION,
18 SHORT FLOW PATH,
19 LONG FLOW PATH,
50 WALL,
90 PROTRUSIONS,
100, 200, 300, 400 HEAT SINK.

The invention claimed is:

1. A heat sink comprising:
a base; and
a plurality of heat radiating fins provided on the base,
wherein the plurality of heat radiating fins comprise a first heat radiating fin of a shape in which a plurality of columns of grooves each meander at a narrow pitch, and a second heat radiating fin that is pin-shaped, the first heat radiating fin and the second heat radiating fin are arranged side by side, and
the first heat radiating fin and the second heat radiating fin are disposed, on an identical flat surface of the base, in parallel to a direction of flow of refrigerant.

2. The heat sink according to claim 1, wherein
when the second heat radiating fin is represented by suffix 1, the first heat radiating fin is represented by suffix 2, h is set as a heat conductivity, P as a fin pressure loss, U as a flow velocity immediately before the refrigerant flows into a fin region, and $\gamma$, $\delta$, m, and n as constants to be uniquely determined by a fin shape, $\delta_1$, $\delta_2$, $\gamma_1$, and $\gamma_2$ represented by $h_1 = \gamma_1 U_1^{m1}$, $P_1 = \delta_1 U_1^{n1}$, $h_2 = \gamma_2 U_2^{m2}$, and $P_2 = \delta_2 U_2^{n2}$ satisfy $(\delta_1/\delta_2)^{0.25} < \gamma_1/\gamma_2$.

3. The heat sink according to claim 1, wherein
the heat sink further comprises a jacket that has a wall provided in a clearance between the first heat radiating fin and the second heat radiating fin, and a clearance between the wall and the first heat radiating fin and a clearance between the wall and the second heat radiating fin are made smaller than a smaller one of a clearance between adjacent fins of the first heat radiating fin and a clearance between adjacent fins of the second heat radiating fin.

4. The heat sink according to claim 2, wherein
the heat sink further comprises a jacket that has a wall provided in a clearance between the first heat radiating fin and the second heat radiating fin, and a clearance between the wall and the first heat radiating fin and a clearance between the wall and the second heat radiating fin are made smaller than a smaller one of the clearance between adjacent fins of the first heat radiating fin and a clearance between adjacent fins of the second heat radiating fin.

5. The heat sink according to claim 1, further comprising a wall that is in between the first heat radiating fin and the second heat radiating fin,
wherein some fins of the second heat radiating fin are formed on the wall.

6. The heat sink according to claim 2, further comprising a wall that is in between the first heat radiating fin and the second heat radiating fin,
wherein some fins of the second heat radiating fin are formed on the wall.

7. The heat sink according to claim 1, wherein
the second heat radiating fin comprises fins that each have a sectional shape of a regular hexagon, and the fins of the second heat radiating fin are disposed so that all sides of the sectional shape of one of the fins are opposite to a side of the sectional shape of another, adjacent one of the fins, respectively, and distances between sides of the fins that are separate from and opposite to one another are equal to each other.

8. The heat sink according to claim 2, wherein
the second heat radiating fin comprises fins that each have a sectional shape of a regular hexagon, and the fins of the second heat radiating fin are disposed so that all sides of the sectional shape of one of the fins are opposite to a side of the sectional shape of another, adjacent one of the fins, respectively, and distances between sides of the fins that are separate from and opposite to one another are equal to each other.

9. The heat sink according to claim 1, wherein
the second heat radiating fin comprises fins that each have a sectional shape of a square, and the fins of the second heat radiating fin are disposed so that all sides of the sectional shape of one of the fins are opposite to a side of the sectional shape of another, adjacent one of the fins, respectively, and distances between sides of the fins that are separate from and opposite to one another are equal to each other.

10. The heat sink according to claim 2, wherein
the second heat radiating fin comprises fins that each have a sectional shape of a square, and the fins of the second heat radiating fin are disposed so that all sides of the sectional shape of one of the fins are opposite to a side of the sectional shape of another, adjacent one of the fins, respectively, and distances between sides of the fins that are separate from and opposite to one another are equal to each other.

11. The heat sink according to claim 1, wherein
the second heat radiating fin comprises fins that each have a sectional shape of a regular triangular, and the fins of the second heat radiating fin are disposed so that all sides of the sectional shape of one of the fins are opposite to a side of the sectional shape of another, adjacent one of the fins, respectively, and distances between sides of the fins that are separate from and opposite to one another are equal to each other.

12. The heat sink according to claim 2, wherein
the second heat radiating fin comprises fins that each have a sectional shape of a regular triangular, and the fins of the second heat radiating fin are disposed so that all sides of the sectional shape of one of the fins are opposite to a side of the sectional shape of another, adjacent one of the fins, respectively, and distances between sides of the fins that are separate from and opposite to one another are equal to each other.

13. The heat sink according to claim 9, wherein
irregularities are provided on each lateral face of each of the fins of the second heat radiating fin.

14. The heat sink according to claim 10, wherein
irregularities are provided on each lateral face of each of the fins of the second heat radiating fin.

15. The heat sink according to claim 11, wherein
irregularities are provided on each lateral face of each of the fins of the second heat radiating fin.

16. The heat sink according to claim 12, wherein
irregularities are provided on each lateral face of each of the fins of the second heat radiating fin.

17. The heat sink according to claim 1, wherein each of the plurality of columns of grooves includes a plurality of 90 degree turns.

* * * * *